US005563559A

United States Patent [19]

Stephens et al.

[11] Patent Number: 5,563,559

[45] Date of Patent: Oct. 8, 1996

[54] FILTERED CONNECTOR HAVING A SINGLE HIGH VOLTAGE SECONDARY CAPACITOR

[75] Inventors: John Stephens, Basingstoke; Aneurin W. Bryant, Salisbury, both of England

[73] Assignee: Smiths Industries PLC, London, England

[21] Appl. No.: 504,471

[22] Filed: Jul. 20, 1995

[30] Foreign Application Priority Data

Aug. 4, 1994 [GB] United Kingdom .................... 9415767

[51] Int. Cl.[6] ................................ H01R 9/03; H03H 7/01

[52] U.S. Cl. ........................... 333/182; 333/185; 439/620

[58] Field of Search .................................... 333/181, 182, 333/183, 184, 185; 439/620

[56] References Cited

U.S. PATENT DOCUMENTS 4,029,386 6/1977 Krantz, Jr. et al. ...................... 439/620
4,617,513 10/1986 Reinhardt ............................ 361/306 X

FOREIGN PATENT DOCUMENTS 2050715 1/1981 United Kingdom .
2256324 12/1992 United Kingdom .
2276993 10/1994 United Kingdom .
975627 11/1994 United Kingdom .

OTHER PUBLICATIONS

Centralab/USCC, "Twin Capacitors Boost Feedthrough–Filter Reliability," *Electronic Design*, vol. 26, p. 182, Jan. 4, 1978.

*Primary Examiner*—Benny Lee
*Assistant Examiner*—Justin P. Bettendorf
*Attorney, Agent, or Firm*—Pollock, Vande Sande & Priddy

[57] ABSTRACT

A filtered connector has an outer metal shell within which extend several electrical contacts. Primary capacitors of tubular shape have their inner plates electrically connected to the contacts. The primary capacitors extend through holes in a metal board to which their outer plates are electrically connected. The board is insulated from the outer shell of the connector apart from a single secondary capacitor connected between the board and the shell. The secondary capacitor is larger than the primary capacitors, so that it is capable of withstanding higher voltages, but it has a lower value of capacitance.

12 Claims, 1 Drawing Sheet

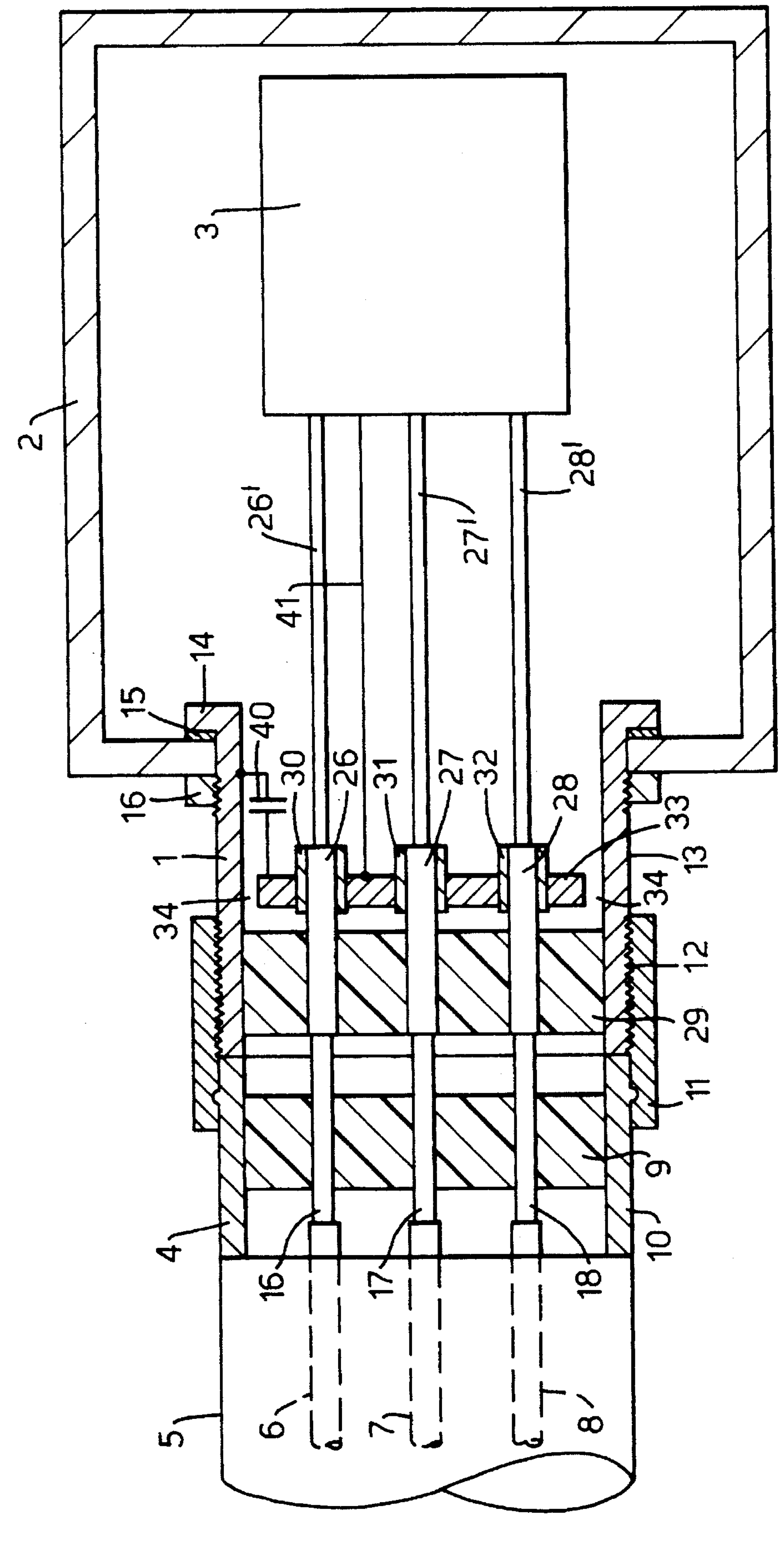
3
2
26'
41
27'
28'
14
15
40
30
26
31
27
32
28
16
33
13
1
34
34
12
29
11
9
4
10
16
17
18
5
6
7
8

FILTERED CONNECTOR HAVING A SINGLE HIGH VOLTAGE SECONDARY CAPACITOR

BACKGROUND OF THE INVENTION

This invention relates to filter assemblies and to connectors and systems including filter assemblies.

The invention is more particularly concerned with filtered connectors, couplings, feedthroughs or the like.

Filtered connectors are used to reduce high frequency interference signals on electrical paths through the connector. The connectors are often used to make connection to electrical apparatus within a housing, so as to minimize the amount of external electrical interference that passes along the electrical path into the housing and to minimize the amount of interference generated within the housing that is transmitted externally of the housing. The construction of filtered connectors usually comprises an external metal shell secured to the housing and adapted to mate with a shell of a cooperating connector. A filter element is connected between the shell and each contact or wire within the filtered connector. The filter element acts as a shunt path for high frequency signals on the contact or wire so that these pass to ground via the shell. The filter element may be a single component or a combination of components such as capacitors and ferrite inductors. The filter element may be a simple capacitive filter, a PI filter, a T filter or a combination of these. It may also be necessary for the connector to include a transient voltage suppressor to reduce the effect of lightning strikes. An example of a filtered connector is described in GB 2233511A.

In some applications, the connector may have a large number of contacts each of which has to be filtered. Because space within the connectors is limited, the size of the filter assembly that can be used is also limited. This creates a particular problem with contacts or lines in the connector required to carry a high dc voltage, because capacitors with a high capacitance and capable of handling a high voltage have a large size. In order to reduce the size sufficiently for the capacitors to be incorporated in a connector, it is usual to use capacitors with a lower capacitance. This has the disadvantage that it reduces the effectiveness of the filtering.

BRIEF SUMMARY OF THE INVENTION

It is an object of the present invention to provide an improved filter assembly.

According to one aspect of the present invention there is provided a filter assembly for filtering high frequency signals, the assembly including a plurality of electrical signal lines and a plurality of primary capacitors one associated with each line, the assembly including a secondary capacitor connected between ground and each of said primary capacitors, and the secondary capacitor being compatible with higher voltages than the primary capacitors.

In this way, the assembly need have only one relatively large, secondary capacitor however many lines are filtered, but can still provide effective filtering.

The primary capacitors preferably each have a larger capacitance than the secondary capacitor and may be 30 times that of the secondary capacitor. The primary capacitors may be tubular capacitors embracing respective signal lines. The primary capacitors are preferably connected between the signal lines and a conductive board extending transversely of the signal lines and the tubular capacitors may be mounted in holes in the conductive board with the secondary capacitor connected between the conductive board and ground.

According to another aspect of the present invention there is provided an electrical connector including a filter assembly according to the above one aspect of the invention.

The connector preferably includes an outer metal shell, the primary capacitors being connected between electrical contacts in the connector and a conductive member, the secondary capacitor being connected between the conductive member and the outer metal shell.

According to a further aspect of the present invention there is provided a system including apparatus and a filter assembly according to the above one aspect of the invention.

The apparatus may be connected to a common point between the primary capacitors and the secondary capacitor.

A system including a connector and filter assembly according to the present invention, will now be described, by way of example, with reference to the accompanying drawing.

BRIEF DESCRIPTION OF THE DRAWING

The drawing is a sectional side elevation of the system.

DETAILED DESCRIPTION OF THE PREFERRED EMBODIMENT

The filter assembly is in the form of a female filtered electrical connector 1 mounted on the housing 2 of electrical apparatus 3, the housing being at ground potential. The connector 1 is adapted to mate with a cooperating male connector 4 mounted at one end of a screened electrical cable 5. For simplicity, the cable 5 is shown as having only three wires 6 to 8 although, in general, the cable would have more than three wires. Each wire 6 to 8 is connected to a respective pin 16 to 18 in the connector 4, the pins being supported in an insulating insert 9 within an outer metal shell 10. The shell 10 supports a rotatable coupling nut 11. The nut 11 is internally threaded at its right-hand end for engagement with an external thread 12 around the left-hand end of an outer metal shell 13 of the female filtered connector 1.

As its right-hand end, the shell 13 of the female filtered connector 1 has an external flange 14 making electrical connection with the inside of the housing 2 via a conductive gasket 15. The flange 14 is urged against the gasket 15 by means of a threaded ring 16 on the connector, which is tightened against the outside of the housing 2.

The female connector 1 contains three electrical signal lines in the form of sockets 26, 27 and 28 in alignment with the pins 16, 17 and 18 respectively in the male connector 4 so that, when the two connectors are mated, the pins extend within the sockets and make electrical connection. Three wires 26' to 28' connect the apparatus 3 to respective ones of the sockets 26 to 28. The sockets 26 to 28 are supported in an insulative insert 29 and each socket supports a primary tubular ceramic capacitor 30 to 32 respectively. The primary capacitors 30 to 32 are of small size, typically about 15 mm long and 6 mm in diameter with a capacitance of about 1.5 nF and a maximum operating voltage of 50 volts. The capacitors 30 to 32 have one plate on their inner surface soldered to respective ones of the sockets 26 to 28 and a second plate on their outer surface soldered to the periphery of respective holes in a conductive, metal board 33 extending transversely of the sockets 26 to 28, parallel and to the right of the insert 29. The board 33 is electrically isolated from direct contact with the shell 13 of the connector by a gap 34 around its outer edge. The board 33, however, is electrically connected to the shell 13 via a secondary capacitor 40. The secondary capacitor 40 is larger in size than the other capacitors 30 to 32 and has a lower capacitance. Typically the capacitance of the secondary capacitor 40 is above about 15 pF, such as 50 pF, making the capacitance of the primary capacitors 30 to 32 larger by a factor of about 30. The size of the secondary capacitor 40 also enables it to survive much higher voltages, typically up to about 3.2 kV.

The board 33 is a common point joining the low voltage capacitors 30 to 32 and this provides a reference point for the apparatus 3, being connected to the apparatus via line 41. The unwanted high frequency common mode and differential mode voltages on lines 6 to 8 are attenuated by the filter assembly 30 to 32, 40 to this reference point. By measuring attenuation of the unwanted high frequency signals between the lines and this reference point, the attenuation of the unwanted signals remains the same, irrespective of the value of the high voltage capacitor 40. This enables the value of the high voltage secondary capacitor 40 to be less than the low voltage primary capacitors 30 to 32, thereby keeping the size of the capacitor to a minimum.

The filters described above are simple capacitor filters but alternative filters including a capacitor could be used. The filters could be connected to the electrical lines in other ways, instead of by tubular capacitors embracing a socket.

The filter assembly need not be a connector but could, for example, be a feedthrough assembly for the housing of apparatus.

What we claim is:

1. A filter assembly for filtering high frequency signals, the assembly comprising: a plurality of electrical signal lines; a plurality of primary capacitors, each primary capacitor having a plate connected with a respective one of said lines; a single secondary capacitor, said secondary capacitor being compatible with higher voltages than said primary capacitors; a connection between one plate of said secondary capacitor and ground; and a connection between another plate of said secondary capacitor and another plate of each of said primary capacitors.

2. A filter assembly according to claim 1, wherein said primary capacitors are tubular capacitors, and wherein said tubular capacitors embrace respective ones of said signal lines.

3. A filter assembly according to claim 1, wherein said primary capacitors each have a larger capacitance than said secondary capacitor.

4. A filter assembly according to claim 3, wherein the capacitance of each of said primary capacitors is about 30 times that of said secondary capacitor.

5. A filter assembly according to claim 1 including a conductive board, said conductive board extending traversely of said signal lines, and wherein the said other plate of each of said primary capacitors is connected to said conductive board.

6. A filter assembly according to claim 5, wherein said primary capacitors are tubular capacitors, wherein said conductive board has a plurality of holes therein, and wherein said tubular capacitors are mounted in said holes in said conductive board.

7. A filter assembly according to claim 5, wherein said secondary capacitor is connected between said conductive board and ground.

8. A filter assembly for filtering high frequency signals, the assembly comprising: a plurality of electrical signal lines; a conductive board extending transversely of said signal lines, said board having a plurality of holes therein; a plurality of primary capacitors of tubular shape, each primary capacitor having an inner plate connected with a respective one of said lines and an outer plate connected with one of said holes in said board; a single secondary capacitor, said secondary capacitor being compatible with higher voltages than said primary capacitors; a connection between one plate of said secondary capacitor and ground; and a connection between another plate of said secondary capacitor and said board.

9. An electrical connector including a filter assembly for filtering high frequency signals, the assembly comprising: a plurality of electrical signal lines extending within said connector; a plurality of primary capacitors, each primary capacitor having a plate connected with a respective one of said lines; a single secondary capacitor, said secondary capacitor being compatible with higher voltages than said primary capacitors; a connection between one plate of said secondary capacitor and ground; and a connection between another plate of said secondary capacitor and another plate of each of said primary capacitors.

10. A connector according to claim 9, wherein the connector includes an outer metal shell and a conductive member insulated from said shell, wherein said electrical signal lines are provided by electrical contacts, wherein said primary capacitors are connected between said electrical contacts and said conductive member, and wherein said secondary capacitor is connected between said conductive member and said outer metal shell.

11. A system comprising an apparatus and a filter assembly for filtering high frequency signals, the filter assembly comprising: a plurality of electrical signal lines; a plurality of primary capacitors, each primary capacitor having a plate connected with a respective one of said lines; a single secondary capacitor, said secondary capacitor being compatible with higher voltages than said primary capacitors; a connection between one plate of said secondary capacitor and ground; and a connection between another plate of said secondary capacitor and another plate of each of said primary capacitors.

12. A system according to claim 11, wherein said apparatus is connected to a common point between said primary capacitors and said secondary capacitor.

* * * * *